(12) United States Patent
Park et al.

(10) Patent No.: US 12,101,990 B2
(45) Date of Patent: Sep. 24, 2024

(54) DISPLAY DEVICE INCLUDING BENDING PROTECTION AND ANTI-REFLECTION LAYERS

(71) Applicant: Samsung Display Co., Ltd., Yongin-si (KR)

(72) Inventors: Dongjin Park, Seongnam-si (KR); Dongwoo Seo, Suwon-si (KR); Jaiku Shin, Hwaseong-si (KR); Sungchul Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/097,452

(22) Filed: Jan. 16, 2023

(65) Prior Publication Data

US 2023/0200200 A1    Jun. 22, 2023

Related U.S. Application Data

(63) Continuation of application No. 17/123,122, filed on Dec. 16, 2020, now Pat. No. 11,563,189.

(30) Foreign Application Priority Data

Mar. 6, 2020 (KR) .................. 10-2020-0028527
Mar. 12, 2020 (KR) .................. 10-2020-0031020

(51) Int. Cl.
*H10K 50/84*    (2023.01)
*B32B 5/18*    (2006.01)
(Continued)

(52) U.S. Cl.
CPC .............. *H10K 77/111* (2023.02); *B32B 5/18* (2013.01); *B32B 7/12* (2013.01); *B32B 17/10* (2013.01);
(Continued)

(58) Field of Classification Search
CPC .. H10K 50/841; H10K 50/86; H10K 50/8426; H10K 50/868; H10K 50/87;
(Continued)

(56) References Cited

U.S. PATENT DOCUMENTS 5,442,470 A * 8/1995 Hashimoto ......... G02F 1/13452
                                                         349/149
9,356,087 B1    5/2016 Lee et al.
(Continued)

FOREIGN PATENT DOCUMENTS

CA    2796515 A1 * 10/2011 ............. F21K 9/232
CN    105977400 A  *  9/2016 ........... F04C 29/0021
(Continued)

OTHER PUBLICATIONS

Notice of Allowance dated Sep. 21, 2022, issued to U.S. Appl. No. 17/123,122.

*Primary Examiner* — Ida M Soward
(74) *Attorney, Agent, or Firm* — CANTOR COLBURN LLP

(57) ABSTRACT

A display device including a display module, an anti-reflection layer, and a bending protection layer. The display module includes a first area, a second area, and a bending area disposed between the first area and the second area and having a predetermined curvature radius. The bending protection layer includes a first portion overlapping at least the first area and a second portion overlapping at least the bending area. The first portion has a maximum thickness in a range from about 40 μm to about 85 μm, a maximum inclined angle in a range from about 10° to 30°, and an elastic modulus in a range from about 50 MPa to about 300 MPa.

21 Claims, 14 Drawing Sheets

(51) Int. Cl.

| | | |
|---|---|---|
| *B32B 7/12* | (2006.01) | |
| *B32B 17/10* | (2006.01) | |
| *B32B 27/28* | (2006.01) | |
| *B32B 27/36* | (2006.01) | |
| *B32B 27/40* | (2006.01) | |
| *H10K 50/844* | (2023.01) | |
| *H10K 50/86* | (2023.01) | |
| *H10K 59/12* | (2023.01) | |
| *H10K 59/40* | (2023.01) | |
| *H10K 71/00* | (2023.01) | |
| *H10K 77/10* | (2023.01) | |
| *F21K 9/66* | (2016.01) | |
| *G02F 1/1333* | (2006.01) | |
| *G06F 1/16* | (2006.01) | |
| *G09F 9/30* | (2006.01) | |
| *H01L 27/146* | (2006.01) | |
| *H01L 33/44* | (2010.01) | |
| *H10K 50/80* | (2023.01) | |
| *H10K 50/842* | (2023.01) | |
| *H10K 50/87* | (2023.01) | |
| *H10K 102/00* | (2023.01) | |

(52) U.S. Cl.
CPC ............ *B32B 27/281* (2013.01); *B32B 27/36* (2013.01); *B32B 27/40* (2013.01); *H10K 50/841* (2023.02); *H10K 50/844* (2023.02); *H10K 50/86* (2023.02); *H10K 59/12* (2023.02); *H10K 59/40* (2023.02); *H10K 71/00* (2023.02); *B32B 2255/00* (2013.01); *B32B 2307/51* (2013.01); *B32B 2307/558* (2013.01); *B32B 2457/20* (2013.01); *F21K 9/66* (2016.08); *G02F 1/133305* (2013.01); *G02F 1/133331* (2021.01); *G06F 1/1641* (2013.01); *G06F 1/1652* (2013.01); *G09F 9/301* (2013.01); *G09G 2300/0408* (2013.01); *G09G 2300/0804* (2013.01); *G09G 2380/02* (2013.01); *H01L 27/14678* (2013.01); *H01L 33/44* (2013.01); *H10K 50/8426* (2023.02); *H10K 50/868* (2023.02); *H10K 50/87* (2023.02); *H10K 2102/311* (2023.02); *H10K 2102/351* (2023.02)

(58) Field of Classification Search
CPC ...... H10K 50/844; H10K 59/12; H10K 59/40; H10K 77/111; H10K 2102/311; H10K 2101/351; H01L 27/14678; H01L 33/44; G02F 1/133331; G02F 1/133305; G06F 1/1641; G06F 1/1652; G09F 9/301; G09G 2300/0408; G09G 2300/0804; G09G 2380/02; B32B 5/18; B32B 7/12; B32B 17/10; B32B 27/281; B32B 27/36; B32B 27/40; B32B 2255/00; B32B 2307/51; B32B 2307/558; B32B 2487/20; F21K 9/66

See application file for complete search history.

(56) References Cited

U.S. PATENT DOCUMENTS

| | | | |
|---|---|---|---|
| 9,780,157 | B2 | 10/2017 | Kwon et al. |
| 9,977,466 | B2 | 5/2018 | Kwon et al. |
| 10,333,087 | B2 | 6/2019 | Choi et al. |
| 10,490,755 | B2 | 11/2019 | Jang et al. |
| 10,520,762 | B2 * | 12/2019 | Jung .................. G02F 1/13452 |
| 10,637,007 | B1 * | 4/2020 | Wang .................. H10K 59/131 |
| 10,658,450 | B2 * | 5/2020 | Chen .................. G09G 3/3225 |
| 11,068,029 | B2 * | 7/2021 | Jeong .................. G06F 1/1626 |
| 2014/0268595 | A1 * | 9/2014 | Eom .................. G02F 1/133305 |
| | | | 29/831 |
| 2015/0261254 | A1 | 9/2015 | Hiroki et al. |
| 2016/0204183 | A1 * | 7/2016 | Tao ...................... H10K 77/111 |
| | | | 438/34 |
| 2018/0059727 | A1 * | 3/2018 | Seo ...................... G06F 1/1656 |
| 2018/0059728 | A1 | 3/2018 | Kim et al. |
| 2018/0081399 | A1 * | 3/2018 | Kwon .................. G09G 5/00 |
| 2018/0090518 | A1 * | 3/2018 | Kim .................. H10K 50/844 |
| 2018/0114951 | A1 | 4/2018 | Namkung |
| 2018/0182983 | A1 * | 6/2018 | Bae ...................... B32B 9/045 |
| 2018/0356917 | A1 * | 12/2018 | Lee .................. H10K 50/86 |
| 2019/0014669 | A1 | 1/2019 | Ahn et al. |
| 2019/0148656 | A1 | 5/2019 | Hiroki et al. |
| 2019/0165332 | A1 * | 5/2019 | Kwon .................. H10K 59/87 |
| 2019/0174658 | A1 * | 6/2019 | Qi ...................... H05K 1/0219 |
| 2019/0213925 | A1 * | 7/2019 | Ha ...................... G09F 9/301 |
| 2019/0372051 | A1 | 12/2019 | Kwon et al. |
| 2019/0373719 | A1 * | 12/2019 | Lee .................. H10K 59/40 |
| 2020/0022261 | A1 | 1/2020 | Choi |
| 2020/0098842 | A1 * | 3/2020 | Jeon .................. H10K 77/111 |
| 2020/0212325 | A1 * | 7/2020 | Seo .................. G06F 1/1616 |
| 2020/0295303 | A1 | 9/2020 | Himura et al. |
| 2020/0358014 | A1 | 11/2020 | Park et al. |
| 2020/0388784 | A1 | 12/2020 | Kim et al. |
| 2021/0179901 | A1 * | 6/2021 | Fujita .................. G02B 5/3033 |

FOREIGN PATENT DOCUMENTS

| | | | | |
|---|---|---|---|---|
| CN | 107004617 A | | 8/2017 | |
| CN | 107665641 A | * | 2/2018 | ............... G09F 9/33 |
| CN | 107871713 A | | 4/2018 | |
| CN | 108962024 A | * | 12/2018 | ............. G09F 9/301 |
| KR | 10-2017-0095809 | | 8/2017 | |
| KR | 20180023133 A | * | 3/2018 | ........... H10K 59/131 |
| KR | 10-2018-0032719 | | 4/2018 | |
| KR | 10-2018-0032742 | | 4/2018 | |
| KR | 20180045983 A | * | 5/2018 | ............. H10K 50/85 |
| KR | 20200031723 A | * | 3/2020 | ............. H10K 50/84 |
| WO | 2019111477 | | 6/2019 | |

* cited by examiner

DISPLAY DEVICE INCLUDING BENDING PROTECTION AND ANTI-REFLECTION LAYERS

CROSS REFERENCE TO RELATED APPLICATIONS

This application is a Continuation of U.S. patent application Ser. No. 17/123,122, filed on Dec. 16, 2020, which claims priority from and the benefit of Korean Patent Application No. 10-2020-0028527, filed on Mar. 6, 2020, and 10-2020-0031020, filed on Mar. 12, 2020, which is hereby incorporated by reference for all purposes as if fully set forth herein.

BACKGROUND

Field

Exemplary embodiments and implementations of the invention relate generally to a display device, and, more specifically, to a foldable display device.

Discussion of the Background

A display device includes an active area that is activated according to an electrical signal. The display device may detect an input applied from the outside through the active area and simultaneously display various images to provide information to a user. In recent years, as display devices having various shapes are developed, active areas having various shapes are realized.

The above information disclosed in this Background section is only for understanding of the background of the inventive concepts, and, therefore, it may contain information that does not constitute prior art.

SUMMARY

It is to be understood that both the foregoing general description and the following detailed description are exemplary and explanatory and are intended to provide further explanation of the invention as claimed.

The inventive concepts provide a display device having a low defect rate.

Additional features of the inventive concepts will be set forth in the description which follows, and in part will be apparent from the description, or may be learned by practice of the inventive concepts.

An embodiment of the inventive concept provides a display device including: a display module including a first area, a second area, and a bending area disposed between the first area and the second area and having a predetermined curvature radius; an anti-reflection layer disposed on the display module and overlapping the first area; and a bending protection layer disposed on the display module, spaced apart from an edge of the anti-reflection layer on a reference plane, and overlapping the first area, the bending area, and the second area. Here, the bending protection layer includes a first portion overlapping at least the first area and a second portion overlapping at least the bending area, the first portion is disposed closer to the anti-reflection layer than the second portion, the first portion has a maximum thickness greater than that of the second portion, and the first portion has a maximum thickness in a range from about 40 µm to about 85 µm, a maximum inclined angle in a range from about 10° to 30°, and an elastic modulus in a range from about 50 MPa to about 300 MPa.

In an embodiment, the first portion may have a maximum inclined angle in a range from about 10° to about 25° and an elastic modulus in a range from about 50 MPa to about 270 MPa.

In an embodiment, the first area of the display module may include a display area on which a pixel is disposed and a non-display area on which the pixel is not disposed. Here, the display area of the display module may include: a base layer; a circuit element layer disposed on the base layer and including a transistor; a display element layer disposed on the circuit element layer and including an emission element electrically connected to the transistor; a thin-film encapsulation layer disposed on the display element layer and configured to seal the emission element; and an input sensor disposed on the thin-film encapsulation layer.

In an embodiment, the first area of the display module may include a display area on which a pixel is disposed and a non-display area on which the pixel is not disposed. Here, the non-display area of the display module may include: a base layer; a plurality of first inorganic layers disposed on the base layer; a plurality of organic layers disposed on the plurality of first inorganic layers; and a plurality of second inorganic layers disposed on the plurality of organic layers.

In an embodiment, the bending protection layer may contact an uppermost inorganic layer of the plurality of second inorganic layers.

In an embodiment, the first portion and the second portion may include the same material as each other.

In an embodiment, each of the first portion and the second portion may include an epoxy-based resin, an acrylic-based resin, an urethane-based resin, or an urethane acrylate-based resin.

In an embodiment, the second portion may have one end contacting the first portion and the other end facing the one end and spaced apart from the first portion, and the display device may further include a step compensation layer disposed on the second area of the display module and disposed adjacent to the other end of the second portion.

In an embodiment, the display device may further include a circuit board coupled to the second area of the display module. Here, the step compensation layer may be disposed between the circuit board and the other end of the second portion.

In an embodiment, the display module may be folded with respect to a folding axis so that one portion of the first area faces another portion of the first area.

In an embodiment, the folding axis may be parallel to a first direction indicating a short side of the display module.

In an embodiment, the bending area may be disposed between the first area and the second area in a second direction crossing the first direction.

In an embodiment, the display device may further include an impact absorbing layer disposed on the anti-reflection layer. Here, a portion of the impact absorbing layer may overlap the bending protection layer.

In an embodiment, the display device may further include a window disposed on the impact absorbing layer and a window protection layer disposed on the window. Here, a portion of the window and a portion of the window protection layer may overlap the bending protection layer.

In an embodiment, the display device may further include a panel protection layer disposed below the display module. Here, the panel protection layer may include a first panel protection layer corresponding to the first area and a second panel protection layer spaced apart from the first panel protection layer and corresponding to the second area.

In an embodiment of the inventive concept, a display device includes: a display module including a first area, a second area, and a bending area disposed between the first area and the second area and having a predetermined curvature radius; an anti-reflection layer disposed on the display module and overlapping the first area; and a bending protection layer disposed on the display module, spaced apart from an edge of the anti-reflection layer on a reference plane, and overlapping the first area, the bending area, and the second area. Here, the bending protection layer includes a first portion overlapping at least the first area and a second portion overlapping at least the bending area, the first portion is disposed closer to the anti-reflection layer than the second portion, the first portion has a maximum thickness greater than that of the second portion, and a maximum stress generated in the display module is determined by mathematical equation:

$$\text{Maximum stress} = 88 - 1.52 \times TH + 1.030 \times SP + 0.278 \times MD + 0.0124 \times TH^2 - 0.0008 \times SP^2 + 0.000857 \times MD^2$$

Here, a reference numeral TH represents a maximum thickness of the first portion, a reference numeral SP represents a maximum inclined angle of the first portion, and a reference numeral MD represents an elastic modulus of the first portion.

In an embodiment, the maximum stress may be equal to or less than about 250 MP.

In an embodiment, the maximum thickness of the first portion may be about 40 μm to about 85 μm, the maximum inclined angle of the first portion may be about 10° to about 25°, and the elastic modulus of the first portion may be about 50 MPa to about 270 MPa.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
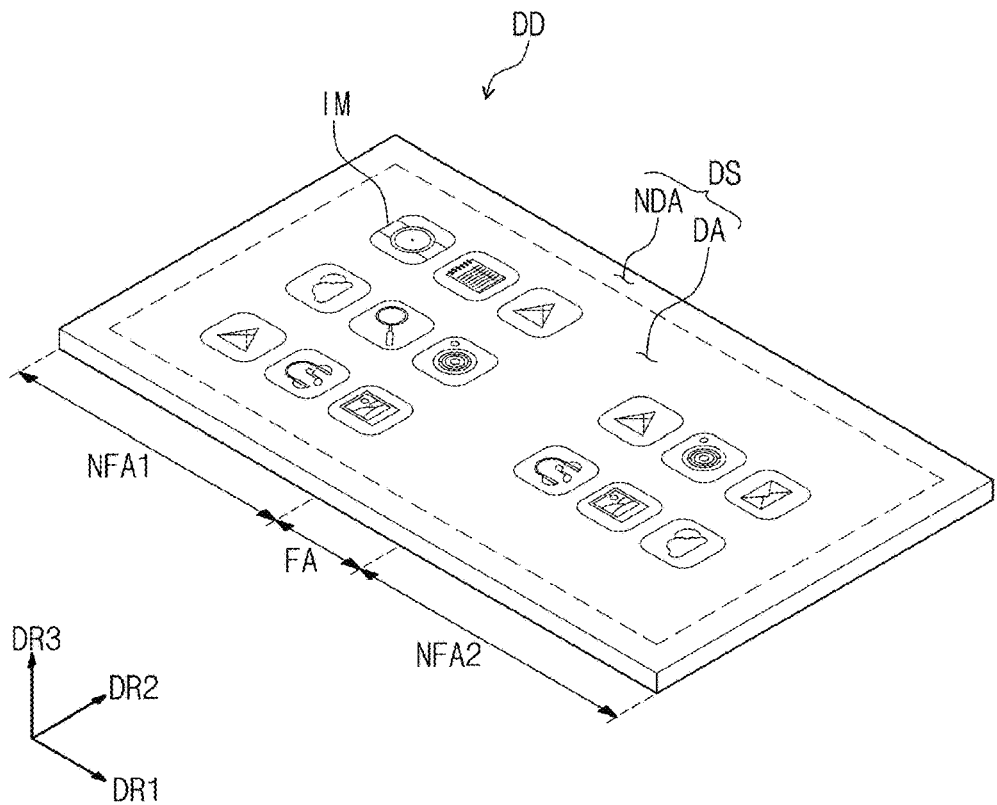
FIGS. 1A and 1B are perspective views illustrating a display device according to an embodiment of the inventive concept.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or to layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
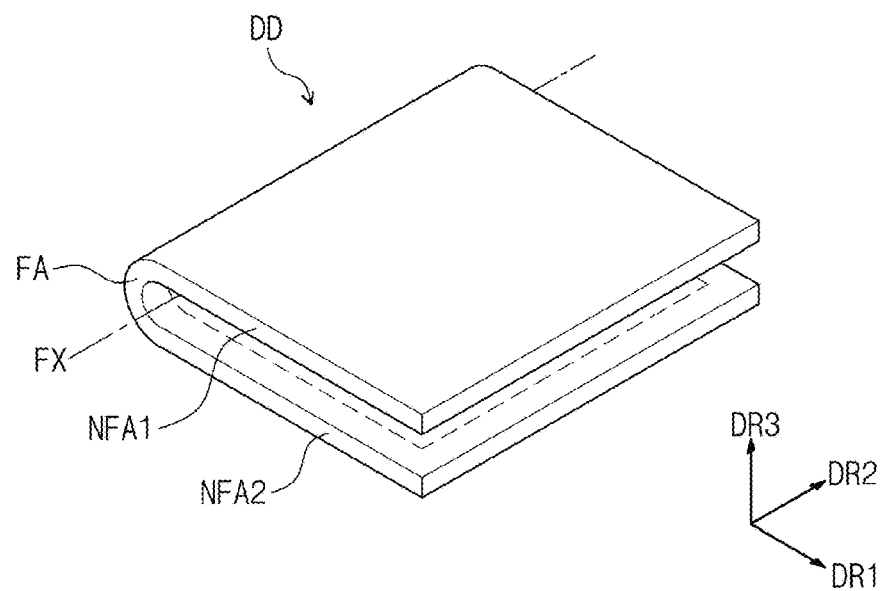

FIGS. 1A and 1B are perspective views illustrating a display device in FIG. 1A. FIG. 1A illustrates an unfolded state, and FIG. 1B illustrates a folded state.

Referring to FIGS. 1A and 1B, a display device DD according to an embodiment of the inventive concept may have a rectangular shape having long sides in a first direction DR1 and short sides in a second direction DR2 crossing the first direction DR1. However, the embodiment of the inventive concept is not limited thereto. For example, the display device DD may have various shapes such as a circular shape or a polygonal shape.

Hereinafter, a direction that crosses a plane defined by the first and second directions DR1 and DR2 in a substantially perpendicular manner is defined as a third direction DR3. In this specification, an expression "viewed on a plane" may be defined as a state when viewed in the third direction DR3. Hereinafter, directions indicated by first to third directional axes may be the first to third directions DR1, DR2, and DR3 and designated by the same reference numerals, respectively.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA, the first non-folding area NFA1, and the second non-folding area NFA2 may be arranged in the first direction DR1.

Non-folding refers to an inability to fold within the respective areas NFA1 or NFA2, for example. Non-folding areas NFA1 and NFA2 still fold, or rotate, about the folder area FA.

Although one folding area FA and two non-folding areas NFA1 and NFA2 are exemplarily illustrated, the embodiment of the inventive concept is not limited to the number of each of the folding area FA and the non-folding areas NFA1 and NFA2. For example, the display device DD may include two or more plurality of non-folding areas and a plurality of folding areas disposed between the non-folding areas.

As illustrated in FIG. 1A, the display device DD includes a flat display surface DS. Through the display surface DS, images IM generated in the display device DD may be provided to a user.

The display surface DS may include a display area DA and a non-display area NDA around the display area DA. The display area DA may display an image, and the non-display area NDA may not display an image. The non-display area NDA may surround the display area DA. However, the embodiment of the inventive concept is not limited thereto. For example, shapes of the display area DA and the non-display area NDA may be deformed.

As illustrated in FIG. 1B, the folding area FA may be folded with respect to a folding axis FX parallel to the second direction DR2. The folding area FA has a predetermined curvature and a predetermined radius of curvature. The display device DD may be in-folded so that the display surface DS is not exposed to the outside, and the first non-folding area NFA1 and the second non-folding area NFA2 face each other.

In an embodiment of the inventive concept, the display device DD may be out-folded so that the display surface DS is exposed to the outside. In an embodiment of the inventive concept, the display device DD may perform an in-folding or out-folding operation from an unfolding operation in a repeated manner. However, the embodiment of the inventive concept is not limited thereto. In an embodiment of the inventive concept, the display device DD may select one of the unfolding operation, the in-folding operation, and the out-folding operation.

Figure 2A:
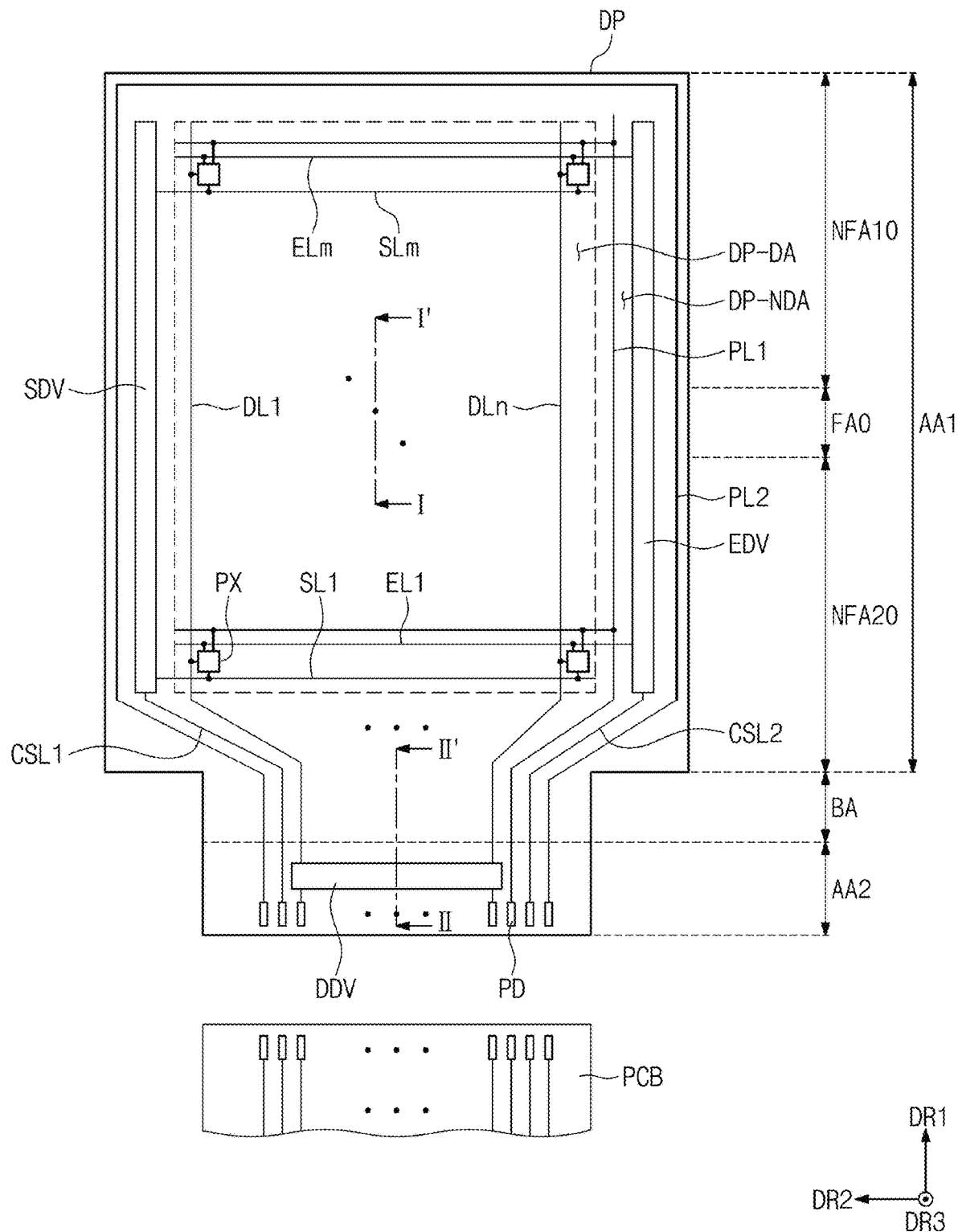
FIG. 2A is a plan view illustrating a display panel according to an embodiment of the inventive concept.
Figure 2B:
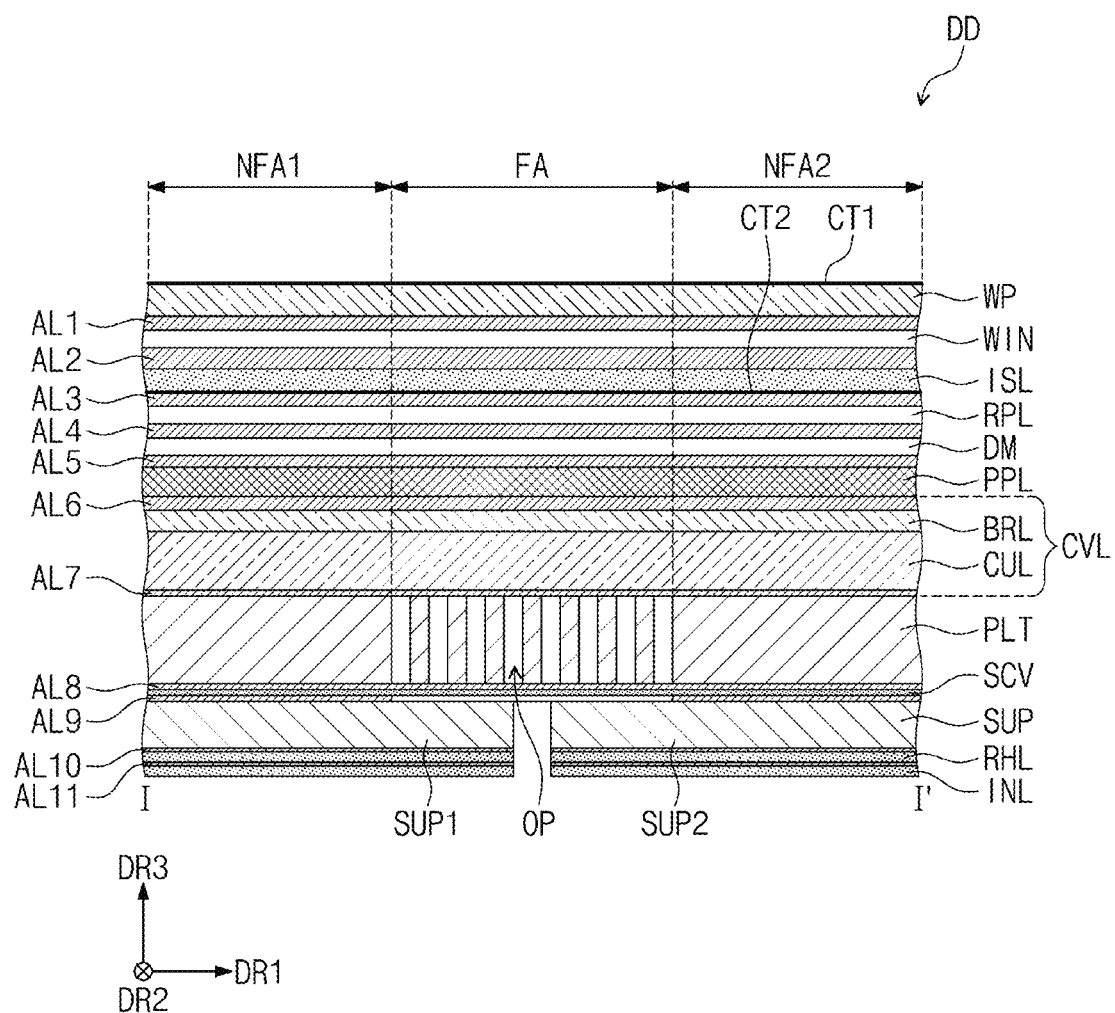
FIG. 2B is a first cross-sectional view illustrating the display device according to an embodiment of the inventive concept.

FIG. 2A is a plan view illustrating a display panel DP according to an embodiment of the inventive concept. FIG. 2B is a first cross-sectional view illustrating the display device DD according to an embodiment of the inventive concept. FIG. 2B illustrates a cross-section of the display device DD taken along line I-I' of FIG. 2A.

Although the display panel DP according to an embodiment of the inventive concept may be a light emitting display panel, the embodiment of the inventive concept is not particularly limited thereto. For example, the display panel DP may be an organic light emitting display panel and a quantum-dot light emitting display panel. The organic light emitting display panel may include a light emitting layer containing an organic light emitting material. The quantum dot light emitting display panel may include a light emitting layer containing a quantum dot and a quantum rod. Hereinafter, the display panel DP will be described as an organic light emitting display panel.

Referring to FIG. 2A, the display panel DP may include a display area DP-DA and a non-display area DP-NDA around the display area DP-DA. The display area DP-DA and the non-display area DP-NDA may be distinguished by whether the pixel PX is provided thereon. The display area DP-DA and the non-display area DP-NDA correspond to the display area DA and the non-display area NDA in FIGS. 1A and 1B, respectively. In this specification, an expression "an area/portion corresponds to an area/portion" may represent that they overlap each other, but they may not have the same surface area. In the non-display area DP-NDA, a scan driver SDV, a data driver DDV, and an emission driver EDV may be disposed.

Figure 5:
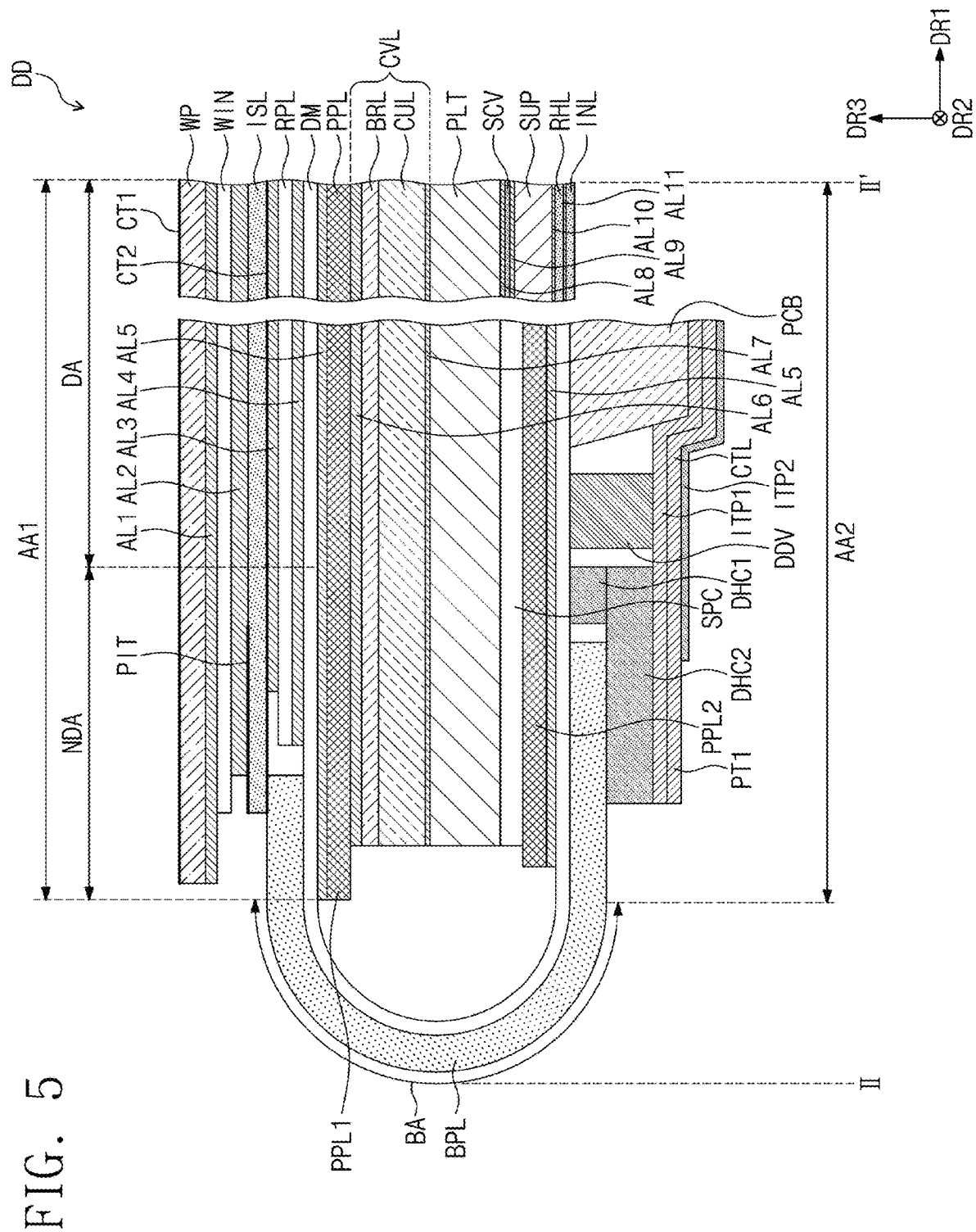

The display panel DP includes a first area AA1, a second area AA2, and a bending area BA, which are distinguished in the first direction DR1. In an unfolded state of the completed display device DD as in FIG. 1A, the first area AA1 and the second area AA2 of the display panel DP mounted to the display device DD are disposed on different planes from each other. This is illustrated in FIG. 5. A bending area BA is disposed between the first area AA1 and the second area AA2. A bending shape of the bending area BA will be described later with reference to FIG. 5. FIG. 2A illustrates an unfolded and unbent state before the display panel DP is mounted to the display device DD.

The first area AA1 corresponds to the display surface DS in FIGS. 1A and 1B. The first area AA1 may include a first non-folding area NFA10, a second non-folding area NFA20, and a folding area FAO. The first non-folding area NFA10, the second non-folding area NFA20, and the folding area FAO correspond to the first non-folding area NFA1, the second non-folding area NFA2, and the folding area FA, respectively.

In the second direction DR2, each of the bending area BA and the second area AA2 may have a length less than that of the first area AA1. The bending area BA and the second area AA2 may be contained in the non-display area DP-NDA.

The display panel DP may include a plurality of pixels PX, a plurality of scan lines SL1 to SLm, a plurality of data lines DL1 to DLn, a plurality of emission lines EL1, first and second control lines CSL1 and CSL2, a first power line PL1, a second power line PL2, and a plurality of pads PD. Here, reference numerals m and n are natural numbers. The pixels PX may be connected to the scan lines SL1 to SLm, the data lines DL1 to DLn, and the emission lines EL1 to ELm.

The data driver DDV may be disposed on the second area AA2. The data driver DDV may be an integrated circuit chip. The scan lines SL1 to SLm may each extend in the second direction DR2 and be connected to the scan driver SDV. The data lines DL1 to DLn may each extend in the first direction DR1 and be connected to the data driver DDV through the bending area BA. The emission lines EL1 to Elm may each extend in the second direction DR2 and be connected to the emission driver EDV.

The first power line PL1 may include a portion extending in the first direction DR1 and a portion extending in the second direction DR2. The portion extending in the first direction DR1 and the portion extending in the second direction DR2 may be disposed on different layers from each other. The portion extending in the first direction DR1 of the first power line PL1 may extend to the second area AA2 through the bending area BA. The first power line PL1 may provide a first voltage to the pixels PX.

The second power line PL2 may be disposed on the non-display area DP-NDA along an edge of the first area AA1. The second power line PL2 may be disposed at an outer portion further than the scan driver SDV and the emission driver EDV.

The first control line CSL1 may be connected to the scan driver SDV and extend toward a lower end of the second area AA2 through the bending area BA. The second control line CSL2 may be connected to the emission driver EDV and extend toward the lower end of the second area AA2 through the bending area BA.

When viewed from a plane, the pads PD may be disposed adjacent to the lower end of the second area AA2. The data driver DDV, the first power line PL1, the second power line PL2, the first control line CSL1, and the second control line CSL2 may be connected to the pads PD. The circuit board PCB may be electrically connected to the pads PD through an anisotropic conductive adhesive layer.

Each of the pixels PX may include an emission element and a pixel driving circuit controlling emission of the emission element. The pixel driving circuit includes a plurality of transistors and at least one capacitor.

Referring to FIG. 2B, the display device DD may include a display module DM, an anti-reflection layer RPL, an impact absorbing layer ISL, a window WIN, a window protection layer WP, a first coating layer CT1, a second coating layer CT2, a panel protection layer PPL, a cover layer CVL, a supporter PLT, a sub-cover layer SCV, a cover plate SUP, a heat dissipation layer RHL, an insulation layer INL, and first to eleventh adhesive layers AL1 to AL11 disposed therebetween. The first to eleventh adhesive layers AL1 to AL11 may include a pressure sensitive adhesive or a transparent adhesive such as an optically clear adhesive.

In an embodiment of the inventive concept, a portion of the above-described components may be omitted. For example, one of the window protection layer WP, the first coating layer CT1, the second coating layer CT2, the panel protection layer PPL, the cover layer CVL, the supporter PLT, the sub-cover layer SCV, the cover plate SUP, the heat dissipation layer RHL, and the insulation layer INL and the adhesive layers related thereto may be omitted.

The anti-reflection layer RPL, the impact absorbing layer ISL, the window WIN, the window protection layer WP, the first coating layer CT1, and the second coating layer CT2 may be disposed on the display module DM. The panel protection layer PPL, the cover layer CVL, the supporter PLT, the sub-cover layer SCV, the cover plate SUP, the heat dissipation layer RHL, and the insulation layer INL may be disposed below the display module DM.

The anti-reflection layer RPL may include an optical film to reduce a reflectance of external light. The anti-reflection layer RPL may include a retarder and/or a polarizer. The anti-reflection layer RPL may include at least a polarizing film.

The anti-reflection layer RPL is disposed on the first area AA1 in FIG. 2A. The anti-reflection layer RPL covers at least the display area DP-DA.

The impact absorbing layer ISL may be disposed on the anti-reflection layer RPL. The impact absorbing layer ISL may absorb an external impact applied to the display module from above the window protection layer WP. The impact absorbing layer ISL may include an elongated synthetic resin film.

For example, the impact absorbing layer ISL may include a flexible plastic material such as polyimide (PI) or polyethyleneterephthalte (PET). The impact absorbing layer ISL may have an elastic modulus of about 1 GPa or more. In an embodiment of the inventive concept, the impact absorbing layer ISL may be omitted.

The window WIN may be disposed on the impact absorbing layer ISL. The window WIN may protect the display module DM and the anti-reflection layer RPL from external scratches. The window WIN may have an optically clear property.

The window WIN may include a glass substrate. The window WIN may include an ultra-thin glass (UTG). However, the embodiment of the inventive concept is not limited thereto. For example, the window WIN may include a synthetic resin film.

The window WIN may have a multilayer structure or a single-layer structure. For example, the window panel WIN may include a plurality of synthetic resin films coupled by an adhesive or a glass substrate and a synthetic resin film coupled by an adhesive.

The window protection layer WP may be disposed on the window WIN. The first coating layer CT1 may be disposed on a top surface of the window protection layer WP. The window protection layer WP and the first coating layer CT1 may protect the window WIN. The window protection layer WP may include a film having an elastic modulus of about 15 GPa or less at a room temperature.

The window protection layer WP may include a flexible plastic material such as polyimide (PI) or polyethyleneterephthalte (PET). The first coating layer CT1 may include a hard coating layer. However, the embodiment of the inventive concept is not limited thereto. For example, the first coating layer CT1 may further include an anti-fingerprint layer or an anti-scattering layer, which is defined as a functional layer.

The second coating layer CT2 may be disposed on a bottom surface of the impact absorbing layer ISL. The second coating layer CT2 may include a hard coating layer. The second coating layer CT2 may flatten the bottom surface of the impact absorbing layer ISL that may have an uneven surface.

The panel protection layer PPL may be disposed below the display module DM. The panel protection layer PPL may protect a lower portion of the display module DM. The panel protection layer PPL may include a flexible plastic material. For example, the panel protection layer PPL may include polyethylene terephthalate (PET). The panel protection layer PPL may not be disposed on the folding area FA.

The cover layer CVL may be disposed below the panel protection layer PPL. The cover layer CVL may absorb an external impact applied from the lower portion of the display module DM. The cover layer CVL may include a barrier layer BRL and a cushion layer CUL. A sixth adhesive layer AL6 and a seventh adhesive layer AL7 may be defined as components of the cover layer CVL.

The barrier layer BRL may be disposed below the panel protection layer PPL. The barrier layer BRL may increase a resistance force against a compression force caused by external pressing. Thus, the barrier layer BRL may prevent the display module DM from being deformed. The barrier layer BRL may include a flexible plastic material such as polyimide (PI) or polyethyleneterephthalte (PET).

The cushion layer CUL may be disposed below the barrier layer BRL. The cushion layer CUL may absorb an external impact applied to the lower portion of the display module DM to protect the display module DM. The cushion layer CUL may include a foam sheet having a predetermined elastic force. The cushion layer CUL may include a foam, a sponge, a polyurethane, or a thermoplastic polyurethane. The cushion layer CUL may be provided directly on a bottom surface of the barrier layer BRL.

At least one of the barrier layer BRL and the cushion layer CUL may absorb light incident from the outside. For example, at least one of the barrier layer BRL and the cushion layer CUL may have a black color. When the display device DD is viewed from above the window protection layer WP, components disposed below the cover layer CVL may not be seen to a user.

The supporter PLT may be disposed below the cover layer CVL (e.g., the cushion layer CUL). The supporter PLT may include a material having an elastic modulus of about 60 GPa or more. The supporter PLT may include a metal material such as stainless steel. Although the supporter PLT may include SUS 304 as an example, the embodiment of the inventive concept is not limited thereto. For example, the supporter PLT may include various metal materials. The supporter PLT may support the display module DM. Also, the supporter PLT may improve a heat dissipation performance of the display device DD.

A plurality of openings OP may be defined in an area of the supporter PLT, which overlaps the folding area FA. The supporter PLT may have a flexibility improved by the openings OP.

A fifth adhesive layer AL5 may be disposed between the display module DM and the panel protection layer PPL. The sixth adhesive layer AL6 may be disposed between the panel protection layer PPL and the barrier layer BRL. The seventh adhesive layer AL7 may be disposed between the cushion layer CUL and the supporter PLT. 있다.

The sub-cover layer SCV may be disposed below the supporter PLT. The sub-cover layer SCV may cover the openings OP defined in the supporter PLT. The sub-cover layer SCV may have an elastic modulus less than that of the supporter PLT. For example, the sub-cover layer SCV may include a thermoplastic polyurethane or rubber. However, the embodiment of the inventive concept is not limited thereto.

The sub-cover layer SCV may be manufactured into a sheet shape and attached to the supporter PLT. An eighth adhesive layer AL8 may be disposed between the sub-cover layer SCV and the supporter PLT, and the sub-cover layer SCV and the supporter PLT may be attached to each other by the eighth adhesive layer ALB. The sub-cover layer SCV may prevent foreign substances from being introduced to the openings OP defined in the supporter PLT.

The cover plate SUP may be disposed below the sub-cover layer SCV. The cover plate SUP may support the first non-folding area NFA1 and the second non-folding area NFA2 of the display module DM. The cover plate SUP may include metal. For example, the cover plate SUP may include a copper alloy. However, this is merely an example. For example, the cover plate SUP may include various metal (e.g., invar or stainless steel).

The cover plate SUP may include a first cover plate SUP1 and a second cover plate SUP2, which are arranged in the first direction DR1. The first cover plate SUP1 may overlap the first non-folding area NFA1 to support the first non-folding area NFA1. The second cover plate SUP2 may overlap the second non-folding area NFA2 to support the second non-folding area NFA2. The first cover plate SUP1 and the second cover plate SUP2 may each extend to the folding area FA and be spaced apart from each other in the folding area FA.

The first cover plate SUP1 and the second cover plate SUP2 may be disposed adjacent to each other in the folding area FA. The first cover plate SUP1 and the second cover plate SUP2 may support a portion, in which the openings OP are defined, of the supporter PLT in the folding area FA. Thus, when a pressure is applied to the portion, in which the openings OP are defined, of the supporter PLT, the cover plate SUP may prevent the portion, in which the openings OP are defined, of the supporter PLT from being deformed. The cover plate SUP may prevent components disposed on the cover plate SUP from being deformed by components disposed below the cover plate SUP.

A ninth adhesive layer AL9 may be disposed between the cover plate SUP and the sub-cover layer SCV. The ninth adhesive layer AL9 may be disposed on an area overlapping the first non-folding area NFA1 and an area overlapping the second non-folding area NFA2. The ninth adhesive layer AL9 may not be disposed on a portion overlapping the folding area FA of the first cover plate SUP1 and a portion overlapping the folding area FA of the second cover plate SUP2.

The heat dissipation layer RHL may be disposed below the cover plate SUP. The heat dissipation layer RHL may be a thermally conductive sheet having a high thermal conductivity. The heat dissipation layer RHL may have a heat dissipation function.

A tenth adhesive layer AL10 may be disposed between the heat dissipation layer RHL and the cover plate SUP. The tenth adhesive layer AL10 may be disposed between the first cover plate SUP1 and the heat dissipation layer RHL and between the second cover plate SUP2 and the heat dissipation layer RHL. The insulation layer INL may be disposed below the heat dissipation layer RHL. An eleventh adhesive layer AL11 may be disposed between the insulation layer INL and the heat dissipation layer RHL.

Figure 3:
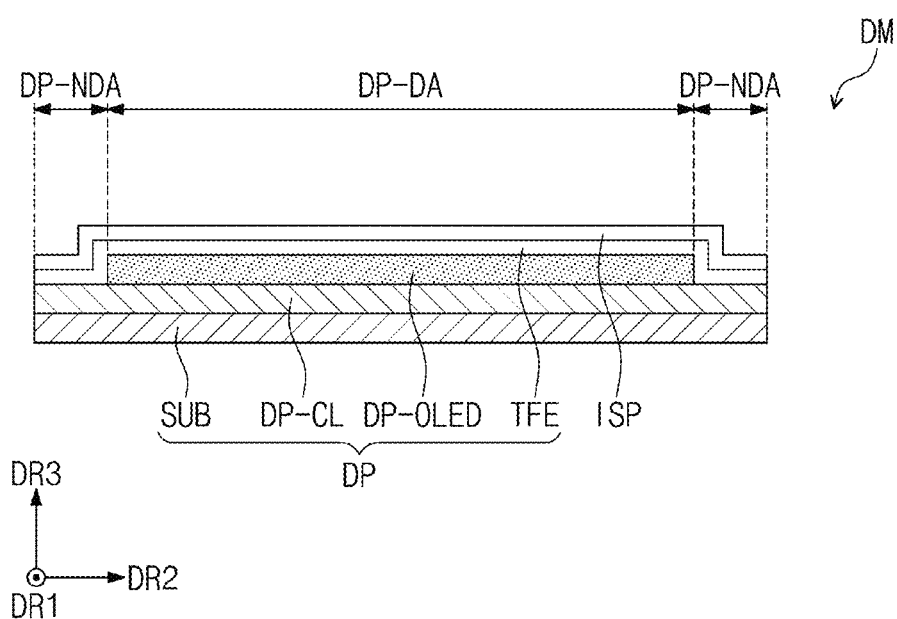
FIG. 3 is a cross-sectional view illustrating a display module according to an embodiment of the inventive concept.

FIG. 3 is a cross-sectional view illustrating the display module DM according to an embodiment of the inventive concept.

Referring to FIG. 3, the display module DM may include the display panel DP and an input sensor ISP. The display panel DP may include a base layer SUB, a circuit element layer DP-CL disposed on the base layer SUB, a display element layer DP-OLED disposed on the circuit element layer DP-CL, and a thin-film encapsulation layer TFE disposed on the display element layer DP-OLED.

The base layer SUB may include a synthetic resin film. For example, the base layer SUB may include polyimide (PI). The base layer SUB may have a multilayer structure. The base layer SUB may include a first synthetic resin film, at least one inorganic layer disposed on the first synthetic resin film, and a second synthetic resin film disposed on the inorganic layer. Each of the first synthetic resin film and the second synthetic resin film may be a polyimide film.

The circuit element layer DP-CL may include an organic layer, an inorganic layer, a semiconductor pattern, a conductive pattern, and a signal line. An organic layer, an inorganic layer, a semiconductor layer, and a conductive layer may be provided on the base layer SUB through coating, deposition, etc. Thereafter, the semiconductor pattern, the conductive pattern, and the signal line may be provided by selectively patterning the organic layer, the inorganic layer, the semiconductor layer, and the conductive layer may be selectively patterned through a plurality of photolithography processes.

The semiconductor pattern, the conductive pattern, and the signal line may provide the pixel driving circuit of the pixels PX and signal lines SL1 to SLm, DL1 to DLn, EL1 to ELm, CSL1, CSL2, PL1, and PL2 described with reference to FIG. 2A. The pixel driving circuit may include at least one transistor.

The display element layer DP-OLED includes the emission element of the pixels PX described with reference to FIG. 2A. The emission element is electrically connected to the at least one transistor. Besides, the display element layer DP-OLED may further include at least one of an organic layer and an inorganic layer.

The thin-film encapsulation layer TFE may be disposed on the circuit element layer DP-CL to cover the display element layer DP-OLED. The thin-film encapsulation layer TFE may include an inorganic layer, an organic layer, and an inorganic layer, which are sequentially laminated. However, the embodiment of the inventive concept is not limited to the laminated structure of the thin-film encapsulation layer TFE.

Substantially, the base layer SUB has the same planar shape as that of the display device DD in FIG. 2A. The base layer SUB is disposed on the display area DP-DA and the non-display area DP-NDA.

The pixel driving circuit of the circuit element layer DP-CL is disposed on the display area DP-DA. Besides, a portion of the signal lines SL1 to SLm, DL1 to DLn, EL1 to ELm, CSL1, CSL2, PL1, and PL2 of the circuit element layer DP-CL is disposed on the display area DP-DA and the non-display area DP-NDA.

The emission element of the display element layer DP-OLED is disposed on the display area DP-DA. The thin-film encapsulation layer TFE is disposed on the display area DP-DA and the non-display area DP-NDA. However, the thin-film encapsulation layer TFE may cover only the display area DP-DA and may not completely cover the non-display area DP-NDA.

The input sensor ISP may include a plurality of electrodes (not illustrated) configured to detect an external input, trace lines (not illustrated) connected to the plurality of electrodes, and an organic layer and/or an inorganic layer configured to insulate/protect the plurality of electrodes or the trace lines. Although the input sensor ISP may be a capacitive sensor, the embodiment of the inventive concept is not limited thereto.

The input sensor ISP may be disposed directly on the thin-film encapsulation layer TFE through a continuous process when the display module DM is manufactured. However, the embodiment of the inventive concept is not limited thereto. For example, the input sensor ISP may be manufactured separately from the display panel DP and then attached to the display panel DP by an adhesive layer.

The plurality of electrodes of the input sensor ISP are disposed on the display area DP-DA. The plurality of trace lines of the input sensor ISP are disposed on the non-display area DP-NDA.

The trace lines may extend toward a lower end of the second area AA2 through the bending area BA so that the trace lines are adjacent to the pad PD in FIG. 2A. Here, the trace lines may be disposed on a different layer from the signal lines SL1 to SLm, DL1 to DLn, EL1 to ELm, CSL1, CSL2, PL1, and PL2 of the circuit element layer DP-CL.

The trace lines may be connected to signal lines (input signal lines) provided for the input sensor ISP of the display panel DP in the first area AA1 in FIG. 2A. Although the input signal lines are different from the signal lines SL1 to SLm, DL1 to DLn, EL1 to ELm, CSL1, CSL2, PL1, and PL2 in FIG. 2A, the input signal lines may be disposed on the same layer as one of the signal lines. Each of the input signal lines may be connected to a corresponding pad PD.

At least one of the organic layer and the inorganic layer of the input sensor ISP is disposed on the first area AA1 in FIG. 2A. At least one of the organic layer and the inorganic layer may extend to the bending area BA.

Figure 4:
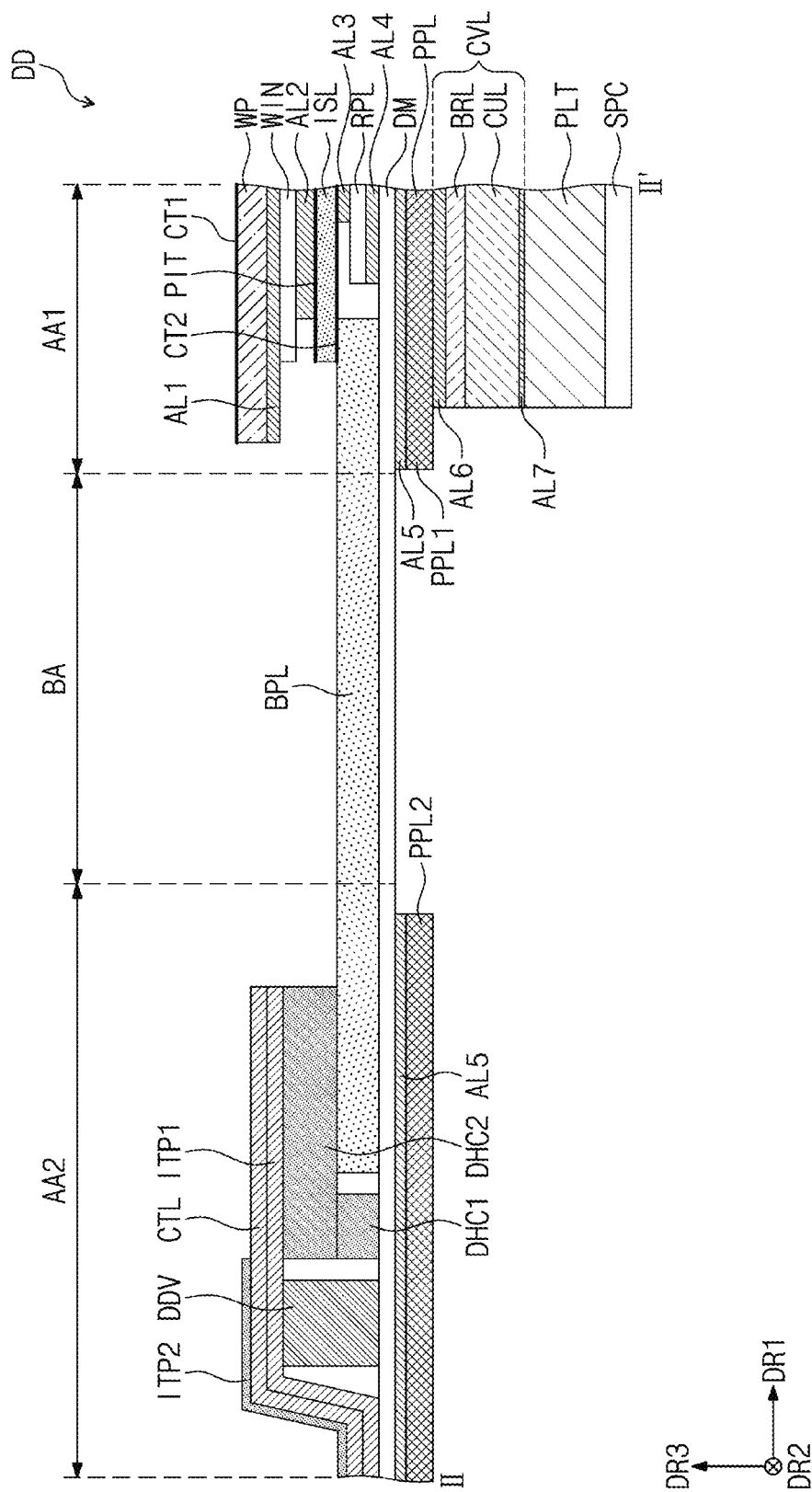
FIGS. 4 and 5 are second cross-sectional views illustrating the display device according to an embodiment of the inventive concept.

FIGS. 4 and 5 are second cross-sectional views illustrating the display device DD according to an embodiment of the inventive concept. FIGS. 4 and 5 are cross-sectional views taken long line II-II' of FIG. 2A. FIG. 4 illustrates a shape before the bending area BA is bent, and FIG. 5 illustrates a shape after the bending area BA is bent. Because a laminated structure of components in FIGS. 4 and 5 is described with reference to FIG. 2B, detailed description thereof will be omitted.

Referring to FIG. 4, the display device DD may further include a bending protection layer BPL, a first step compensation layer DHC1, a second step compensation layer DHC2, a first insulating tape ITP1, a second insulating tape ITP2, a conductive layer CTL, and a spacer SPC.

The bending protection layer BPL is disposed on at least the bending area BA. The bending protection layer BPL may overlap the bending area BA, the first area AA1, and the second area AA2. The bending protection layer BPL may be disposed on a portion of the first area AA1 and a portion of the second area AA2, but not the entireties of the first are AA1 and the second area AA2.

The bending protection layer BPL has one end that is spaced apart from an edge of the anti-reflection layer RPL on a reference plane. A reason of being spaced will be described with reference to FIGS. 8A to 8C. The bending protection layer BPL has the other end that is spaced apart from the first step compensation layer DHC1 on the reference plane. The first step compensation layer DHC1 is disposed adjacent to the other end of the bending protection layer BPL. The first step compensation layer DHC1 is disposed between the other end of the bending protection layer BPL and the data driver DDV on a second reference plane.

The second step compensation layer DHC2 may contact the first step compensation layer DHC1 and the bending protection layer BPL. The second step compensation layer DHC2 may be disposed between the first step compensation layer DHC1 and the bending protection layer BPL.

Each of the first step compensation layer DHC1 and the second step compensation layer DHC2 may be defined as a double-sided tape. For example, each of the first step compensation layer DHC1 and the second step compensation layer DHC2 may include a base layer having a flexibility such as polyethyleneterephthalte (PET) and an adhesive disposed on each of top and bottom surfaces of the base layer. The adhesive may include an acrylic-based adhesive. However, the embodiment of the inventive concept is not limited to the materials of the base layer and the adhesive.

The first step compensation layer DHC1 may have the substantially same thickness as that of the bending protection layer BPL. A sum of a thickness of the first step compensation layer DHC1 and a thickness of the second step compensation layer DHC2 may be substantially the same as that of the data driver DDV. A stepped portion between the bending protection layer BPL and the data driver DDV may be compensated by the first and second step compensation layers DHC1 and DHC2.

The first insulating tape ITP1 may be attached to the second step compensation layer DHC2 and the data driver DDV. The conductive layer CTL may be disposed on the first insulating tape ITP1. The conductive layer CTL may be a ground layer configured to remove a static electricity generated from the outside. The second insulating tape ITP2 may be disposed on the conductive layer CTL. The second insulating tape ITP2 may partially expose the conductive layer CTL. A portion of the conductive layer CTL, which overlaps the second step compensation layer DHC2, is exposed.

Referring to FIG. 5, the bending area BA may be bent so that the second area AA2 is disposed below the first area AA1. Thus, the data driver DDV of the second area AA2 may be disposed below the first area AA1. That is, the first area AA1 and the second area AA2 may be disposed on different planes (or reference planes). The bending area BA is bent to protrude in a transverse direction on a cross-section. The bending area BA has a predetermined curvature and a predetermined curvature radius. The curvature radius may be about 0.1 mm to about 0.5 mm.

The bending protection layer BPL may be bent in conjunction with the bending area BA. The bending protection layer BPL may protect the bending area BA from an external impact and control a neutral plane of the bending area BA. The bending protection layer BPL is attached to the bending area BA so that the signal lines disposed on the bending area BA are disposed adjacent to the neutral plane. Detailed description on the bending protection layer BPL will be described later with reference to FIGS. 6 to 7B.

The panel protection layer PPL may include a first panel protection layer PPL1 protecting the first area AA1 and a second panel protection layer PPL2 protecting the second area AA2. When the bending area BA is bent, the second panel protection layer PPL2 may be disposed below the first area AA1 and the first panel protection layer PPL1 in conjunction with the second area AA2. Because the panel protection layer PPL is not disposed on the bending area BA, the bending area BA may be further easily bent.

Hereinafter, an edge alignment state of components will be simply described with reference to FIG. 5. Hereinafter, particular sides of components represent particular sides disposed adjacent to the bending area BA. Also, description about the particular sides represents a state when viewed on a plane. When the particular sides of the components are compared, the particular sides are disposed at an outer side in a direction adjacent to the bending area BA and disposed at an inner side in a direction away from the bending area BA.

When viewed on a plane, one side of the window protection layer WP and one side of the window WIN may not overlap the bending area BA. Although the display device DD is in-folded, the window protection layer WP and the window WIN may not protrude to the outside further than the bending area BA. Because one side of the window protection layer WP is disposed at a further outer side than one side of the window WIN, the window protection layer WP may sufficiently cover the window WIN to protect the window WIN.

One side of the impact absorbing layer ISL may be substantially aligned with one side of the window WIN. The one side of the impact absorbing layer ISL may be disposed at a further outer side than one side of the anti-reflection layer RPL. A portion adjacent to the one side of the impact absorbing layer ISL may overlap the bending protection layer BPL.

A printed layer PIT may be disposed on an edge area adjacent to the one side of the impact absorbing layer ISL. The printed layer PIT may be disposed on a top surface of the impact absorbing layer ISL. The printed layer PIT may correspond to the non-display area DP-NDA of the first area AA1 FIG. 2A on a plane. Although the printed layer PIT may have a black color as an example, the embodiment of the inventive concept is not limited thereto. For example, the printed layer PIT may have various colors.

One side of the first panel protection layer PPL1 may be disposed at a further outer side than the one side of the window protection layer WP. The one side of the first panel protection layer PPL1 may be disposed at a further outer side than one side of the cover layer CVL. The one side of the cover layer CVL may be disposed between the one side of the window protection layer WP and the one side of the window WIN. Although one side of the barrier layer BRL, one side of the cushion layer CUL, one side of the sixth adhesive layer AL6, and one side of the seventh adhesive layer AL7 are aligned with each other, the embodiment of the inventive concept is not limited thereto. For example, the one side of the barrier layer BRL, the one side of the cushion layer CUL, the one side of the sixth adhesive layer AL6, and the one side of the seventh adhesive layer AL7 may not be aligned with each other.

The spacer SPC may be disposed between the supporter PLT and the second panel protection layer PPL2. Although one side of the supporter PLT and one side of the spacer SPC may be aligned with the one side of the cover layer CVL, the embodiment of the inventive concept is not limited thereto. For example, the one side of the supporter PLT and the one side of the spacer SPC may not be aligned with the one side of the cover layer CVL.

The spacer SPC may be a double-sided tape. For example, the spacer SPC may include a base layer having a flexibility such as polyethyleneterephthalte (PET) and an adhesive disposed on each of top and bottom surfaces of the base layer. As the supporter PLT and the second panel protection layer PPL2 are spaced apart from each other by the spacer SPC, the bending area BA may maintain a preset curvature.

In the embodiment, because the one side of each of the cover layer CVL, the supporter PLT, and the spacer SPC is disposed at a further inner side than the one side of the first panel protection layer PPL1, the cover layer CVL, the supporter PLT, and the spacer SPC may not overlap the bending area BA. A contact damage of the bending area BA due to the cover layer CVL, the supporter PLT, and the spacer SPC may be prevented.

One side of the second panel protection layer PPL2 may be disposed at a further inner side than the one side of the first panel protection layer PPL1. The one side of the second panel protection layer PPL2 may be disposed between the one side of the first panel protection layer PPL1 and the one side of the cover layer CVL.

One side of each of the second step compensation layer DHC2, the first insulating tape ITP1, and the conductive layer CTL may be disposed at a further inner side than that one side of the first panel protection layer PPL1. The one side of each of the second step compensation layer DHC2, the first insulating tape ITP1, and the conductive layer CTL may be spaced apart from the other end of the bending area BA. Thus, the second step compensation layer DHC2, the first insulating tape ITP1, and the conductive layer CTL may be less affected by a shear stress generated by bending of the bending area BA.

Figure 6:
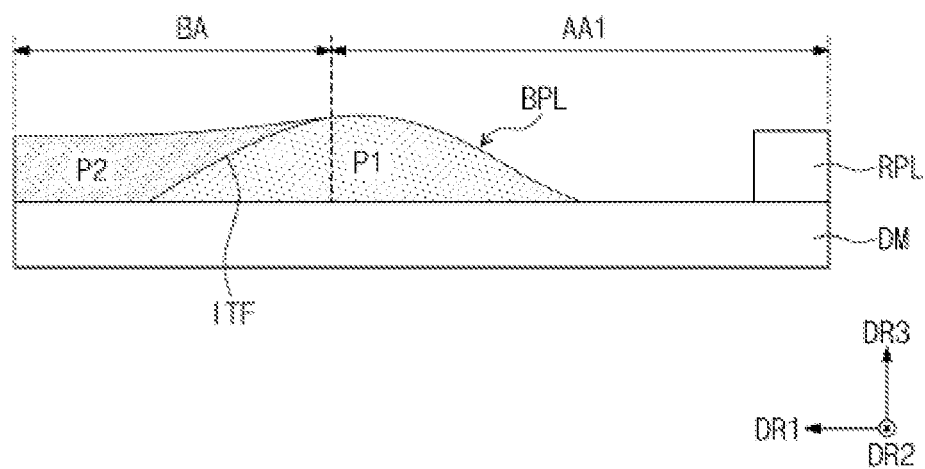
FIG. 6 is an enlarged cross-sectional view illustrating a bending protection layer according to an embodiment of the inventive concept.
Figure 7A:
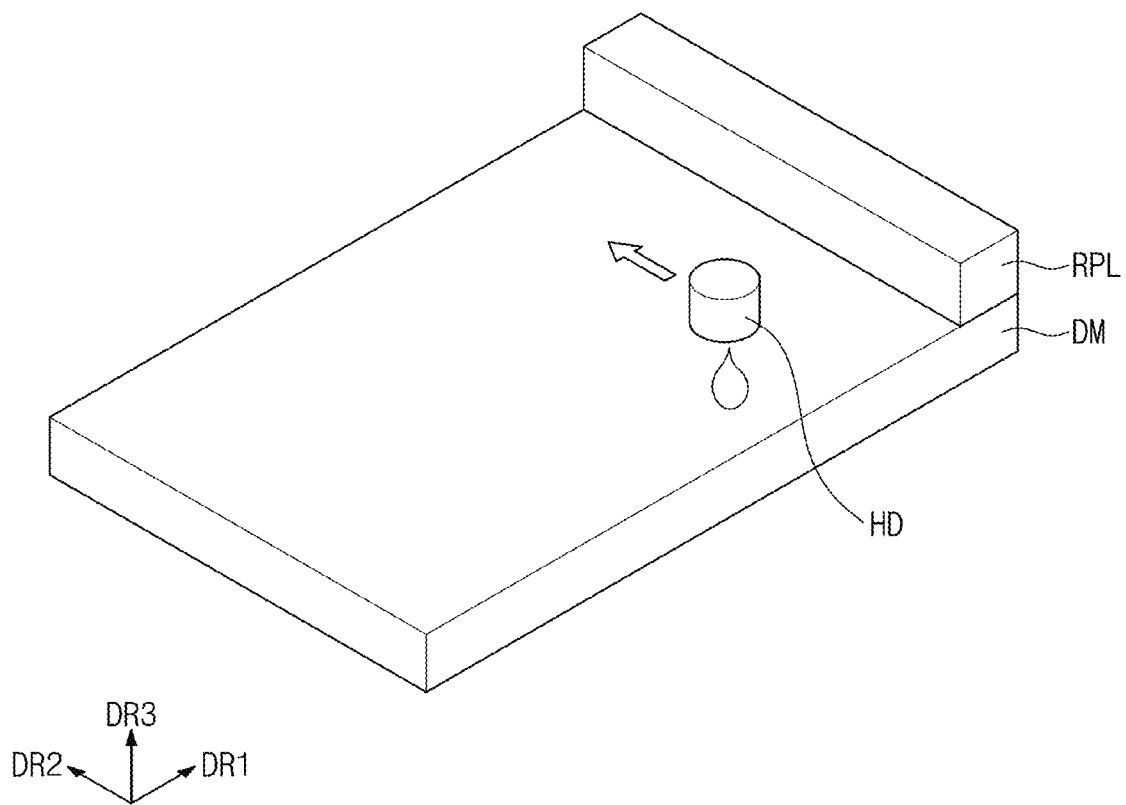
FIGS. 7A and 7B are perspective views illustrating a method of forming the bendable protection layer according to an embodiment of the inventive concept.
Figure 7B:
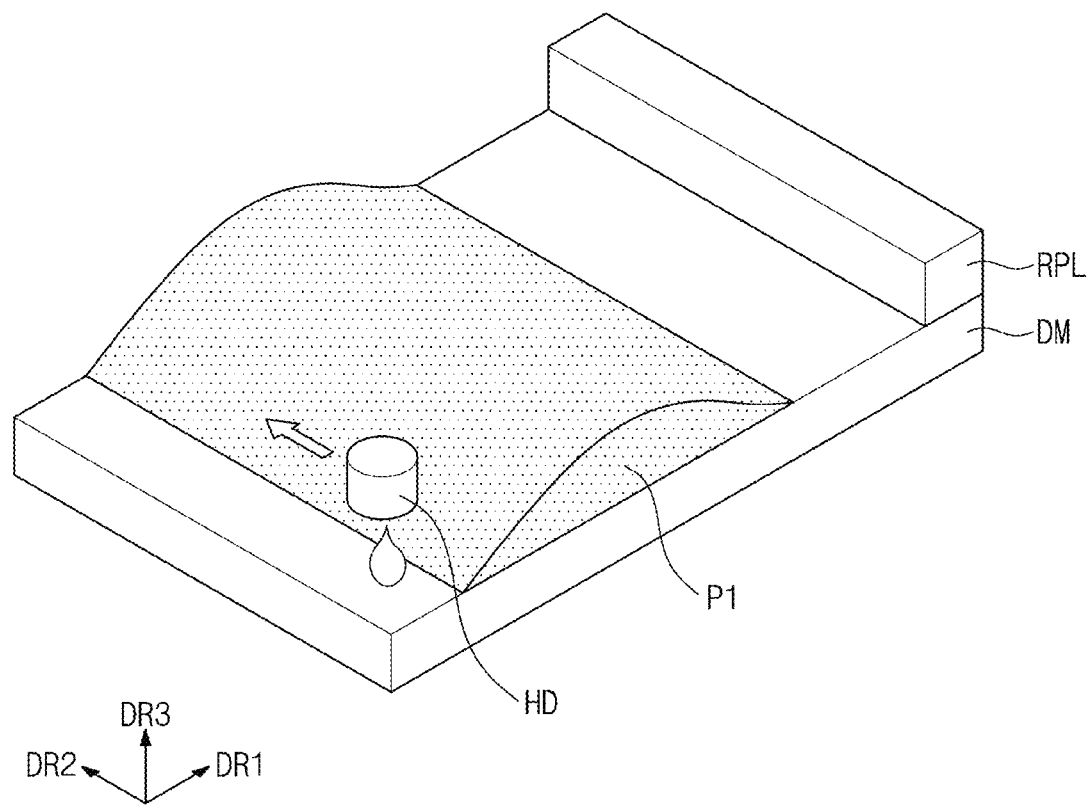

FIG. 6 is an enlarged cross-sectional view illustrating a bending protection layer BPL according to an embodiment of the inventive concept. FIGS. 7A and 7B are perspective views illustrating a method of forming the bending protection layer BPL according to an embodiment of the inventive concept. In FIGS. 6 to 7B, the sixth adhesive layer AL6 disposed between the anti-reflection layer RPL and the display module DM is not illustrated.

The bending protection layer BPL may include a first portion P1 and a second portion P2. Because the first portion P1 and the second portion P2 are formed through different processes, the first portion P1 and the second portion P2 may be distinguished from each other, with an interface ITF being defined between the first portion P1 and the second portion P2. Each of the first portion P1 and the second portion P2 of the bending protection layer BPL may include an epoxy-based resin, an acrylic-based resin, an urethane-based resin, or an urethane acrylate-based resin. The first portion P1 and the second portion P2 may include the same material.

In the first direction DR1, the first portion P1 may be disposed closer to the anti-reflection layer RPL than the second portion P2. In the first direction DR1, the first portion P1 may be spaced a predetermined distance from an end of the anti-reflection layer RPL. The first portion P1 may overlap at least the first area AA1. In the embodiment, the first portion P1 may have one portion overlapping the first area AA1 and the other portion overlapping the bending area BA (refer to FIG. 5).

The first portion P1 may have a maximum thickness greater than the second portion P2 and an area less than the second portion P2. The second portion P2 overlaps at least the bending area BA. Referring to FIG. 4, though not illustrated in FIG. 6, most of a portion overlapping the bending area BA corresponds to the second portion P2. Also, the second portion P2 may extend from the bending area BA to the second area AA2.

As illustrated in FIG. 7A, on the display module DM, a resin composition is applied to an area spaced a predetermined distance from the end of the anti-reflection layer RPL. In the second direction DR2, an inkjet head HD forms a resin line while moving. This line-type resin composition corresponds to a preliminary-first portion. A property of the resin composition is determined by a composition ratio of materials of the resin composition. The resin composition may include at least one synthetic resin and at least one additive. Thus, a shape, a thickness, a width (a length in the first direction DR1), and an inclined angle of the preliminary-first portion may be determined. Also, an elastic modulus of the first portion P1 is determined by the composition ratio of the materials of the resin composition.

The first portion P1 in FIG. 7B is formed by curing the preliminary-first portion. The first portion P1 has a curved profile on a cross-section defined by the first direction DR1 and the third direction DR3 by the above-described manufacturing process.

Thereafter, the resin composition is applied to the bending area BA and the second area AA2. The first portion P1 blocks the resin composition from flowing to the anti-reflection layer RPL. That is, the first portion P1 serves as a dam. A resin layer may be formed by applying the resin composition on a large area unlike the line-type preliminary-first portion. A coating method or a method of using the inkjet head as in FIG. 7B may be used. The resin layer corresponds to a preliminary-second portion.

Because the first portion P1 is firstly formed, the resin layer may be prevented from being widely spread. As a result, the preliminary-second portion having a constant thickness may be formed. Thereafter, the second portion P2 is formed by curing the preliminary-second portion.

Figure 8A:
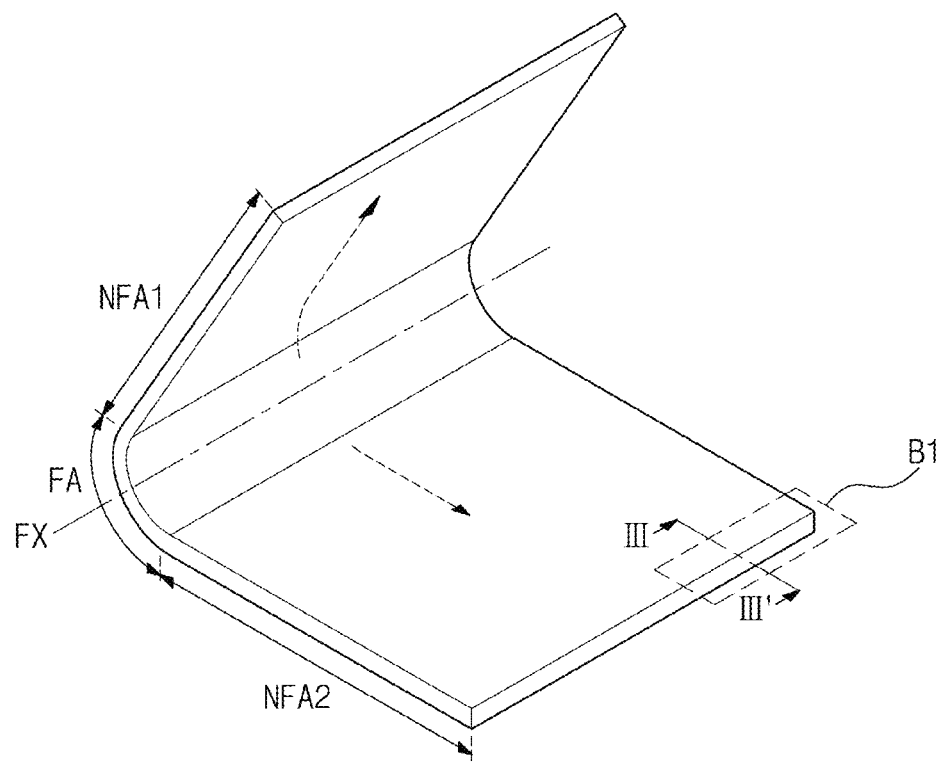
FIGS. 8A to 8C are views illustrating a variation generated during a folding operation of the display device according to an embodiment of the inventive concept.
Figure 8B:
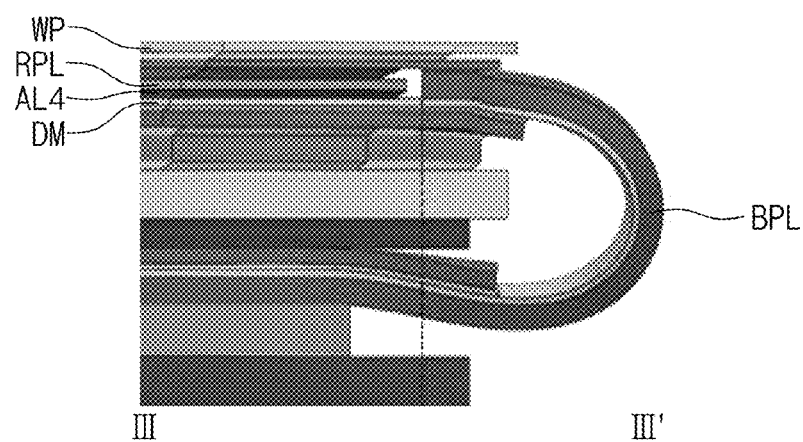
Figure 8C:
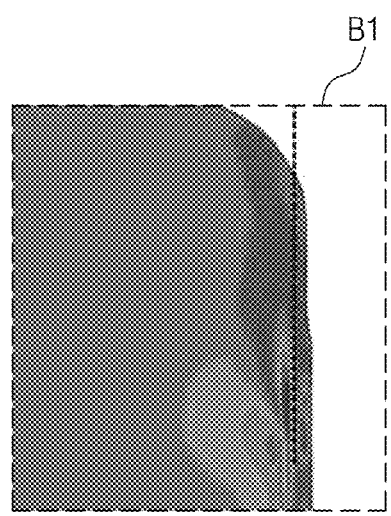

FIGS. 8A to 8C are views of variations generated during a folding operation of the display device according to an embodiment of the inventive concept.

As illustrated in FIG. 8A, when the display device DD is in-folded with respect to the folding axis FX, a shear stress is generated in the first direction DR1 as illustrated by two dotted line arrows. When the shear stress is generated in the display device, the first to eleventh adhesive layers AL1 to AL11 (refer to FIG. 2B) may be elongated. As a result, a variation may be generated between the aligned components.

As illustrated in FIG. 8B, during bending several components including the window protection layer WP move to a right side on a cross-section. The anti-reflection layer RPL also moves to the right side further than a state before being bent.

FIG. 8C illustrates a stress generated in an area B1 adjacent to an edge of the display device DD. A stress may be concentrated on the edge of the display device DD by the shear stress.

As described with reference to FIG. 4, because an end of the bendable protection layer BPL is spaced apart from an edge of the anti-reflection layer RPL on a reference plane, interference between the anti-reflection layer RPL and the bending protection layer BPL may not be generated although the shear stress is generated. Thus, a defect such as delamination of the anti-reflection layer RPL may be prevented.

Figure 9A:
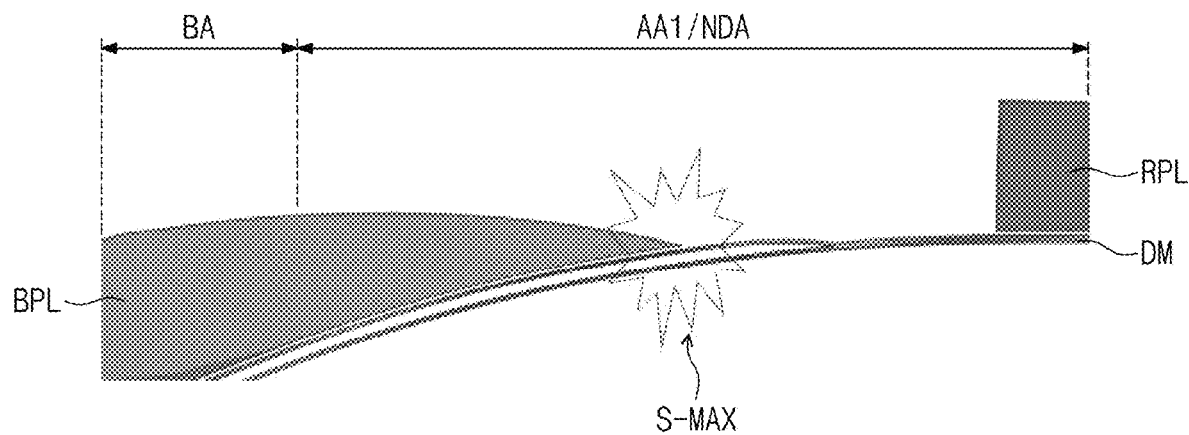
FIGS. 9A and 9B are views illustrating a display device according to an embodiment of the present invention.
Figure 9B:
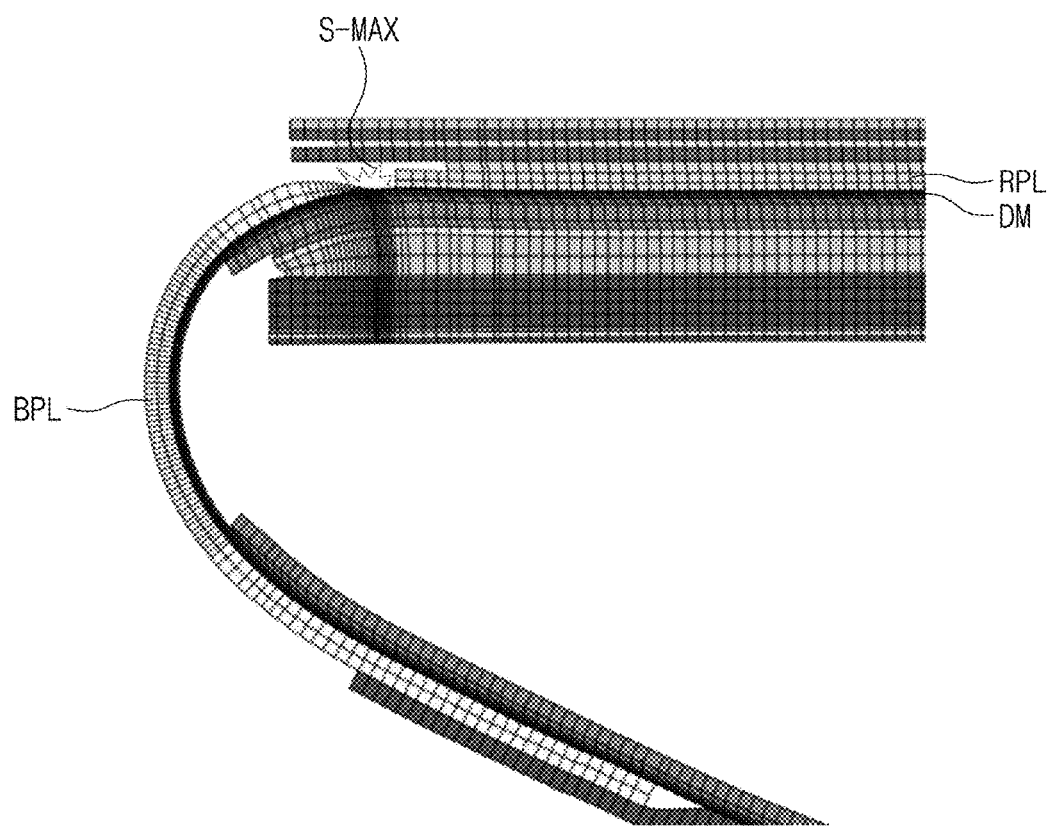
Figure 9C:
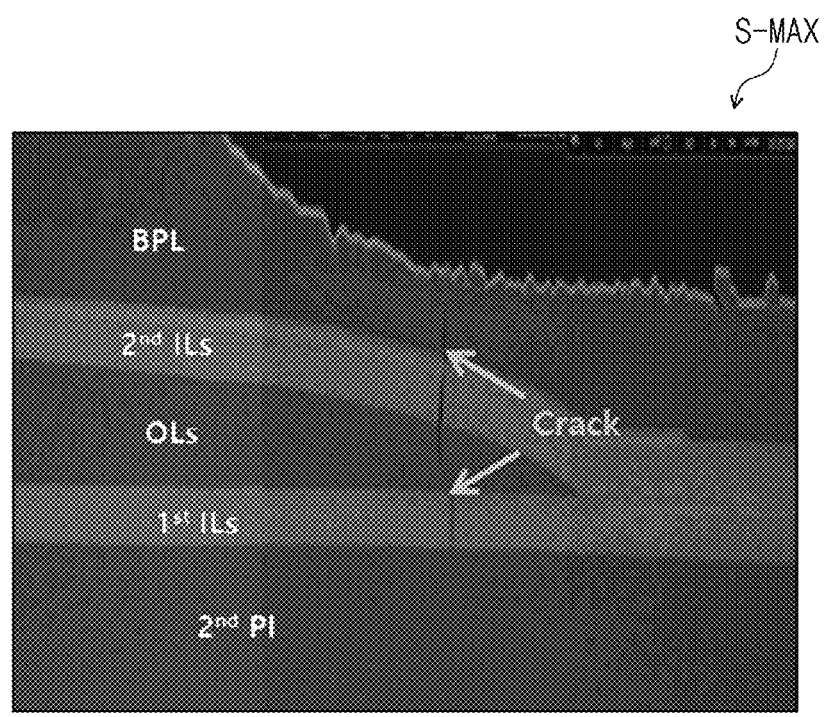
FIG. 9C is a photograph illustrating a defect generated in the display device.
Figure 10:
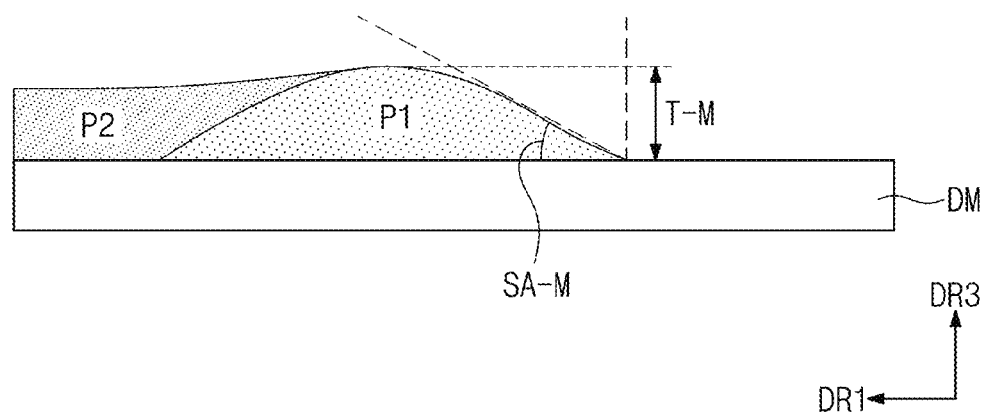
FIG. 10 is a view illustrating a factor of the bending protection layer, which determines a stress of the display module.

FIGS. 9A and 9B are views illustrating the display device DD according to an embodiment of the inventive concept. FIG. 9C is a photograph illustrating a defect generated in the display device DD. FIG. 10 is a view illustrating a factor of the bending protection layer, which determines a maximum stress of the display module.

FIG. 9A illustrates a time to initiate a variation from a state before bending the display device DD of FIG. 4 to a bent state of FIG. 5. A maximum stress is generated in a specific area of the display module DM by the bending operation during a process of manufacturing the display device DD. The maximum stress represents a stress value just before a damage occurs in the display module DM or the same stress value when the damage occurs in the display module DM. Hereinafter, this area is defined as a reference area S-MAX.

The reference area S-MAX corresponds to an area adjacent to one end of both ends of the bending protection layer BPL, which is adjacent to the anti-reflection layer RPL. As illustrated in FIG. 9B, a deformation may be generated in components disposed below the display module DM during the bending operation. The reference area S-MAX may be generated in an area in which the components disposed below the display module DM have a great resistance and thus are not deformed. The reference area S-MAX is disposed on the non-display area NDA adjacent to the bending area BA of the first area AA1.

FIG. 9C illustrates a crack generated in the display module DM due to a stress. In FIG. 9C, a second synthetic resin film $2^{nd}$ PI of the base layer SUB described with reference to FIG. 3 is illustrated. A plurality of first inorganic layers $1^{st}$ ILs are disposed on the second synthetic resin film $2^{nd}$ PI. A plurality of organic layers OLs are disposed on the plurality of first inorganic layers $1^{st}$ ILs. A plurality of second inorganic layers $2^{nd}$ ILs are disposed on the plurality of organic layers OLs. The bending protection layer BPL is disposed on an uppermost inorganic layer of the plurality of second inorganic layers $2^{nd}$ ILs. The bending protection layer BPL contacts the uppermost inorganic layer.

The plurality of organic layers OLs may be sealed by the plurality of first inorganic layers $1^{st}$ ILs and the plurality of second inorganic layers $2^{nd}$ ILs. The plurality of first inorganic layers $1^{st}$ ILs represent that the inorganic layers contained in the circuit element layer DP-CL in FIG. 3 are disposed on the first area AA1 in FIG. 2A. The plurality of organic layers OLs represent that at least one organic layer contained in the circuit element layer DP-CL in FIG. 3 are disposed on the first area AA1 in FIG. 2A. A portion of the plurality of organic layers OLs may be an organic layer contained in the display element layer DP-OLED in FIG. 3. The plurality of second inorganic layers $2^{nd}$ ILs represent that the inorganic layers contained in the thin-film encapsulation layer TFE in FIG. 3 are disposed on the first area AA1 in FIG. 2A. A portion of the second inorganic layers $2^{nd}$ ILs may be an inorganic layer contained in the input sensor ISP.

According to an embodiment of the inventive concept, a maximum value of the stress generated in the reference area S-MAX may be determined by a factor of the first portion P1 in FIG. 10. The maximum stress generated in the reference area S-MAX may be varied according to a maximum thickness T-M, a maximum inclined angle SA-M, and an elastic modulus of the first portion P1. In consideration of a process of forming the first portion P1, the maximum thickness T-M is generated at a peak point, and the maximum inclined angle SA-M is generated on a top surface of the display module DM.

Table 1 below illustrates results of a portion of a plurality of experimental examples. A bending operation is performed on samples that are modeled like the display device DD described in FIGS. 4 and 5 with a curvature radius of about 0.25 mm.

TABLE 1

|  |  | 1 | 2 | 3 | 4 | 5 | 6 | 7 | 8 | 9 | 10 |
|---|---|---|---|---|---|---|---|---|---|---|---|
| First portion (P1) | Max thickness (μm) | 0 | 0 | 00 | 10 | 0 | 0 | 0 | 0 | 0 | 0 |
|  | Max inclined angle (°) | 0 | 0 | 0 | 0 | 0 | 0 | 0 | 0 | 0 | 0 |
|  | Elastic modulus (MPa) | 50 | 50 | 50 | 50 | 50 | 50 | 50 | 00 | 00 | 50 |
| Relative stress value |  | .895 | .924 | .962 | .014 | .848 | .943 | .033 | .739 | .075 | .270 |

Referring to first to fourth experimental examples #1, #2, #3, and #4, the maximum stress may gradually increase as the maximum thickness T-M of the first portion P1 increases. Referring to fifth to seventh experimental examples #5, #6, and #7, the maximum stress may gradually increase as the maximum inclined angle SA-M of the first portion P1 increases. Referring to eighth to tenth experimental examples #8, #9, and #10, the maximum stress may gradually increase as the elastic modulus of the first portion P1 increases.

The maximum thickness of the first portion P1 may be in a range from about 40 μm to about 85 μm. When the thickness of the first portion P1 is less than about 40 μm, the first portion P1 may not sufficiently serve as a dam. When the thickness of the first portion P1 is greater than about 85 μm, the first portion P1 may interfere with other components, e.g., the impact absorbing layer ISL illustrated in FIG. 5.

The maximum inclined angle SA-M of the first portion P1 may be in a range from about 10° to about 30° to reduce a stress of the display panel DP, which is generated in the bending area BA. When the maximum inclined angle SA-M of the first portion P1 is less than about 10°, a width of the first portion P1 may increase to satisfy the thickness of the first portion P1, and, as a result, an area of the first portion P1 may increase. More preferably, the maximum inclined angle SA-M may be in a range from about 10° to about 25°.

The modulus of the first portion P1 may be in a range from about 50 MPa to about 300 MPa. When the modulus of the first portion P1 is less than about 50 MPa, the first portion P1 may be vulnerable to an external impact, and when greater than about 300 MPa, a crack may be easily generated. More preferably, the modulus of the first portion P1 may be in a range from about 50 MPa to about 270 MPa.

As illustrated in table 1, the maximum stress MP generated in the reference area S-MAX may increase as the maximum thickness T-M, the maximum inclined angle SA-M, and the elastic modulus of the first portion P1 increase.

Mathematical equation 1 below is derived by evaluating and analyzing the maximum stress generated according to the maximum thickness T-M, the maximum inclined angle SA-M, and the elastic modulus.

$$\text{Maximum stress} = 88 - 1.52 \times TH + 1.030 \times SP + 0.278 \times MD + 0.0124 \times TH^2 - 0.0008 \times SP^2 + 0.000857 \times MD^2 \quad \text{[Mathematical Equation 1]}$$

That is, the maximum stress may be determined by the maximum thickness T-M, the maximum inclined angle SA-M, and the elastic modulus. A weight affecting the maximum stress is varied according to each factor.

In the display device DD described with reference to FIGS. 4 and 5, the maximum stress may be equal to or less than about 250 MP. That is, the maximum thickness T-M, the maximum inclined angle SA-M, and the elastic modulus of the first portion P1 are determined so that the maximum stress generated in the display module DM is equal to or less than about 250 MP. More preferably, the maximum thickness T-M, the maximum inclined angle SA-M, and the elastic modulus of the first portion P1 are determined so that the maximum stress is equal to or less than about 210 MP.

According to the embodiment of the inventive concept, the bending area of the display panel may be protected against an external impact. As the bending protection layer BPL absorbs the external impact, cracking of the display panel may be prevented.

Although shear stress is generated in the display panel during the folding operation, the interference between the bending protection layer and the other components of the display device is not generated. The interference is not generated because the bending protection layer is spaced apart from the other components, e.g., the polarizing film, of the display device on the reference plane.

The bending protection layer includes the first portion and the second portion, which are provided through different processes. The first portion is disposed closer to the polarizing film than the second portion. As the first portion satisfies the above-described reference, the damage of the inorganic layer, which is generated in a partial area of the display module, may be prevented.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Hence, the real protective scope of the present invention shall be determined by the technical scope of the accompanying claims.

What is claimed is:

1. A display device comprising:
   a base layer comprising a first area, a second area, and a bending area disposed between the first area and the second area;
   an anti-reflection layer disposed on the base layer in the first area;
   a window disposed on the anti-reflection layer; and
   a bending protection layer disposed on the base layer, spaced apart from an edge of the anti-reflection layer in a cross-sectional view, and overlapping the first area and the bending area,
   wherein:
   the bending protection layer comprises a first portion overlapping at least the first area in a plan view and a second portion overlapping at least the bending area;
   the first portion is disposed closer to the anti-reflection layer than is the second portion; and
   the first portion has a maximum thickness greater than a maximum thickness of the second portion.

2. The display device of claim 1, wherein the first portion has a maximum thickness in a range from about 40 μm to about 85 μm.

3. The display device of claim 1, wherein the first portion has a maximum inclined angle in a range from about 10° to about 30°.

4. The display device of claim 1, wherein the first portion has an elastic modulus in a range from about 50 MPa to about 300 MPa.

5. The display device of claim 1, wherein the first portion has a maximum inclined angle in a range from about 10° to about 25° and an elastic modulus in a range from about 50 MPa to about 270 MPa.

6. The display device of claim 1, wherein:
the first area of the base layer comprises a display area on which a pixel is disposed and a non-display area on which the pixel is not disposed; and
the display device further comprises:
a thin-film encapsulation layer on the base layer; and
an input sensor disposed on the thin-film encapsulation layer.

7. The display device of claim 1, wherein:
the first area of the base layer comprises a display area on which a pixel is disposed and a non-display area on which the pixel is not disposed; and
the display device further comprises:
a plurality of first inorganic layers disposed on the base layer and overlapping the non-display area;
a plurality of organic layers disposed on the plurality of first inorganic layers and overlapping the non-display area; and
a plurality of second inorganic layers disposed on the plurality of organic layers and overlapping the non-display area.

8. The display device of claim 7, wherein the bending protection layer contacts an uppermost inorganic layer of the plurality of second inorganic layers.

9. The display device of claim 1, wherein the first portion and the second portion comprise the same material.

10. The display device of claim 1, wherein:
the second portion has one end contacting the first portion and the other end facing the one end spaced apart from the first portion; and
the display device further comprises a step compensation layer disposed on the second area of the base layer and disposed adjacent to the other end of the second portion.

11. The display device of claim 10, further comprising a circuit board coupled to the second area of the base layer,
wherein the step compensation layer is disposed between the circuit board and the other end of the second portion.

12. The display device of claim 1, further comprising an impact absorbing layer disposed between the anti-reflection layer and the window,
wherein a portion of the impact absorbing layer overlaps the bending protection layer.

13. The display device of claim 12, further comprising a window protection layer disposed on the window,
wherein a portion of the window and a portion of the window protection layer overlap the bending protection layer.

14. The display device of claim 12, further comprising a panel protection layer disposed below the base layer,
wherein the panel protection layer comprises a first panel protection layer corresponding to the first area and a second panel protection layer spaced apart from the first panel protection layer and corresponding to the second area.

15. A foldable display device comprising:
a base layer comprising a first area, a second area, and a bending area disposed between the first area and the second area;
an anti-reflection layer disposed on the base layer in the first area;
a protection layer disposed on the anti-reflection layer; and
a bending protection layer disposed on the base layer, spaced apart from an edge of the anti-reflection layer in a cross-sectional view, and overlapping the first area and the bending area,
wherein:
the bending protection layer comprises a first portion overlapping the protection layer in a plan view and a second portion overlapping at least the bending area;
the first portion is disposed closer to the anti-reflection layer than is the second portion;
the first portion has a maximum thickness greater than a maximum thickness of the second portion; and
the base layer is folded with respect to a folding axis so that one portion of the first area faces the second area.

16. The foldable display device of claim 15, wherein the first portion has a maximum thickness in a range from about 40 µm to about 85 µm.

17. The foldable display device of claim 15, wherein the first portion has a maximum inclined angle in a range from about 10° to about 30°.

18. The foldable display device of claim 15, wherein the first portion has an elastic modulus in a range from about 50 MPa to about 300 MPa.

19. The foldable display device of claim 15, wherein the first portion has a maximum inclined angle in a range from about 10° to about 25° and an elastic modulus in a range from about 50 MPa to about 270 MPa.

20. The foldable display device of claim 15, wherein the first portion and the second portion comprise the same material.

21. A display device comprising:
a base layer comprising a first area, a second area, and a bending area disposed between the first area and the second area;
an anti-reflection layer disposed on the base layer in the first area;
a window disposed on the anti-reflection layer; and
a bending protection layer disposed on the base layer, spaced apart from an edge of the anti-reflection layer in a cross-sectional view, and overlapping the first area and the bending area,
wherein:
the bending protection layer comprises a first portion overlapping at least the first area in a plan view and a second portion overlapping at least the bending area;
the first portion is disposed closer to the anti-reflection layer than is the second portion;
the first portion has a maximum thickness greater than a maximum thickness of the second portion; and
an interface is defined between the first portion and the second portion.

* * * * *